United States Patent
Abele et al.

(10) Patent No.: US 9,496,682 B2
(45) Date of Patent: Nov. 15, 2016

(54) LASER DRIVER AND METHOD OF OPERATING A LASER

(71) Applicant: Intel Corporation, Santa Clara, CA (US)

(72) Inventors: Nicolas Abele, Demoret (CH); Mohammed Adham, Katana (CA)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/653,186

(22) PCT Filed: Dec. 18, 2012

(86) PCT No.: PCT/EP2012/075962
§ 371 (c)(1),
(2) Date: Jun. 17, 2015

(87) PCT Pub. No.: WO2014/094827
PCT Pub. Date: Jun. 26, 2014

(65) Prior Publication Data
US 2015/0333478 A1  Nov. 19, 2015

(51) Int. Cl.
*H01S 5/06* (2006.01)
*H01S 5/062* (2006.01)
(Continued)

(52) U.S. Cl.
CPC ........... *H01S 5/0617* (2013.01); *G02B 26/105* (2013.01); *H01S 5/0014* (2013.01); *H01S 5/06216* (2013.01); *H04N 9/3135* (2013.01); *H04N 9/3194* (2013.01)

(58) Field of Classification Search
CPC .............. H01S 5/0617; H01S 5/0014; H01S 5/06216; G02B 26/105; H04N 9/3135; H04N 9/3194
See application file for complete search history.

(56) References Cited

U.S. PATENT DOCUMENTS

| 5,081,631 A | 1/1992 | Dhurjaty |
| 5,764,664 A | 6/1998 | Yip et al. |

(Continued)

FOREIGN PATENT DOCUMENTS

| EP | 0625842 A1 | 11/1994 |
| EP | 1322123 A2 | 6/2003 |

OTHER PUBLICATIONS

International Search Report, Mailed Date: Oct. 31, 2013, Application No. PCT/EP2012/075962, Filed Date: Dec. 18, 2012, pp. 6.

*Primary Examiner* — Frank Font

(57) ABSTRACT

According to the present invention there is provided a method of operating a laser comprising the steps of; defining an intensity value ($K_{VIDEO\ red}$, $K_{VIDEO\ green}$, $K_{VIDEO\ blue}$) for a light beam which is to be output from the laser; determining if the defined intensity value is greater than, or less than, a threshold intensity ($K_{TH\ red}$, $K_{TH\ green}$, $K_{TH\ blue}$) for the laser, wherein the threshold intensity is the intensity of the light which is output from the laser when the input current to the laser is equal to the threshold current ($I_{TH\ red}$, $I_{TH\ green}$, $I_{TH\ blue}$) of the laser, wherein the threshold current ($I_{TH\ red}$, $I_{TH\ green}$, $I_{TH\ blue}$) of the laser is an input current value below which the laser would operate in its light emitting region and equal to, or above which, the laser will operate in its laser region; operating the laser using current from at least a DAC current source if the defined intensity value ($K_{VIDEO\ red}$, $K_{VIDEO\ green}$, $K_{VIDEO\ blue}$) is greater than the threshold intensity ($K_{TH\ red}$, $K_{TH\ green}$, $K_{TH\ blue}$), wherein the DAC current source operates the laser by inputting to the laser a continuous current which has an amplitude which is greater than the threshold current ($I_{TH\ red}$, $I_{TH\ green}$, $I_{TH\ blue}$) of the laser, and which has an amplitude such that the laser is operated to output a light beam which has an intensity equal to the defined intensity value ($K_{VIDEO\ red}$, $K_{VIDEO\ green}$, $K_{VIDEO\ blue}$); and operating the laser using current from the PWM current source only, if the defined intensity value ($K_{VIDEO\ red}$, $K_{VIDEO\ green}$, $K_{VIDEO\ blue}$) is less than the threshold intensity ($K_{TH\ red}$, $K_{TH\ green}$, $K_{TH\ blue}$), wherein the PWM current source operates the laser by inputting to the laser a current which has an amplitude which is at least equal to the threshold current value ($I_{TH\ red}$, $I_{TH\ green}$, $I_{TH\ blue}$) of the laser, and wherein the duration of time over which the PWM current source inputs its current to the laser is such that the laser is operated to output a light beam which has an intensity equal to the defined intensity value ($K_{VIDEO\ red}$, $K_{VIDEO\ green}$, $K_{VIDEO\ blue}$). There is further provided a corresponding laser driver.

19 Claims, 10 Drawing Sheets

(51) Int. Cl.
*G02B 26/10* (2006.01)
*H01S 5/00* (2006.01)
*H04N 9/31* (2006.01)

(56) References Cited

U.S. PATENT DOCUMENTS

| | | | |
|---|---|---|---|
| 2006/0221021 A1* | 10/2006 | Hajjar | G03B 21/567 |
| | | | 345/84 |
| 2008/0175286 A1* | 7/2008 | Kamijima | H04N 9/3194 |
| | | | 372/30 |
| 2008/0273123 A1* | 11/2008 | Morikawa | H04N 9/3105 |
| | | | 348/757 |
| 2009/0244407 A1* | 10/2009 | Sakakibara | H04N 9/3194 |
| | | | 348/759 |
| 2009/0256973 A1 | 10/2009 | Bazzani | |
| 2009/0274185 A1 | 11/2009 | Champion | |
| 2010/0265278 A1 | 10/2010 | Nishioka et al. | |
| 2011/0128602 A1 | 6/2011 | Hamano et al. | |
| 2012/0120116 A1* | 5/2012 | Seo | H04N 9/3135 |
| | | | 345/690 |
| 2012/0133902 A1* | 5/2012 | Nishioka | G02B 27/48 |
| | | | 353/31 |
| 2013/0207950 A1* | 8/2013 | Haruna | H04N 9/3182 |
| | | | 345/207 |

* cited by examiner

| K | Time duration |
|---|---|
| K=0 | $t_{K0}$= 1 ns |
| ... | ... |
| ... | ... |
| ... | ... |
| ... | ... |
| K=$K_{TH}$ - 1 | $t_{KTH-1}$= 20 ns |

<Look up table 1>

Figure 4a

| K | Current |
|---|---|
| K=$K_{TH}$ | $I_{TH}$ |
| ... | ... |
| ... | ... |
| ... | ... |
| ... | ... |
| K=$K_{(2^D-1)}$ | $I_{(2^D-1)}$ |

<Look up table 2>

Figure 4b

LASER DRIVER AND METHOD OF OPERATING A LASER

FIELD OF THE INVENTION

The present invention concerns a method of operating a laser to provide a light beam with a low power value while still maintaining the operation of the laser in its laser region. There is further provided a corresponding laser driver.

DESCRIPTION OF RELATED ART

Typically projection devices comprise at least three lasers, which emit red, green and blue light beams respectively. The light beams emitted from each of the lasers are used to define pixels of a projected image. Depending on the colour of the pixel to be projected the appropriate optical output power of red, green and blue light is emitted from each of the respective lasers. The optical output power is the amount of energy of a photon flux produced by a light source, typically defined in mW for laser light sources and found in the laser diode datasheet.

A laser's operation is not linear across its operating range; A laser has two distinct operating regions; a first non-linear operating region and a second linear operating region. In the non-linear operating region the power output of the laser does not vary linearly as a function of current input to the laser. In the linear region, the power output of the laser does varies linearly (approximately) as a function of current input to the laser. The linear operating region is referred the lasing region, and the non-linear operating region is known as the light emitting region, or the spontaneous emission region.

The input current to the laser will determine in which operating region the laser will operate. A threshold current is the minimum input current required to operate the laser in its lasing region; if the input current is below the threshold current then the laser will operate in its light emitting region, and if the input current is equal to, or greater than, the threshold current then the laser will operate in its lasing region. In order to emit a low intensity light the input current to the laser will be below the threshold current, so the laser will operate in its light emitting region. On the other hand to emit a high intensity light the input current to the laser will be above the threshold current, so the laser will operate in its lasing region.

Projection systems typically comprise a MEMS (Micro-electromechanical systems) mirror which reflects the light from the lasers and oscillates to scan a projection beam over a display surface to project consecutive pixels of a projected image on the display surface. The MEMS mirror oscillates fast enough so that the consecutive pixels which are projected are visible to a viewer as a complete projected image. For each pixel of a projected image the appropriate intensity of red, green and blue light which defines that pixel must be emitted by the lasers during a discrete time slot i.e. before the MEMS mirror has oscillated to project the next consecutive pixel.

The colour of certain pixels of the projected image may require the laser to emit low intensity of red, green or blue light during this discrete time slot; thus during the discrete time slot the input current to the laser will be below the threshold current and the laser will operate in its light emitting region. When the laser is operating in its light emitting region, the light beam emitted from the laser is difficult to collimate. Consequently, the light beam will have a non-circular spot size resulting in a deformation of the projected image.

The light emitted by the laser when operating in light emitting region is therefore undesirable for image projection and it is more desirable to operate the laser in its lasing region when using the laser for image projection.

It is an aim of the present invention to obviate or mitigate at least some of the above-mentioned disadvantages.

BRIEF SUMMARY OF THE INVENTION

According to the present invention there is provided a method of operating a laser comprising the steps of; defining an intensity value for a light beam which is to be output from the laser; determining if the defined intensity value is greater than, or less than, a threshold intensity for the laser, wherein the threshold intensity is the intensity of the light which is output from the laser when the input current to the laser is equal to the threshold current of the laser, wherein the threshold current of the laser is an input current value below which the laser would operate in its light emitting region and equal to, or above which, the laser will operate in its laser region; operating the laser using current from at least a DAC current source if the defined intensity value is greater than the threshold intensity, wherein the DAC current source operates the laser by inputting to the laser a continuous current which has an amplitude which is greater than the threshold current of the laser, and which has an amplitude such that the laser is operated to output a light beam which has an intensity equal to the defined intensity value; and operating the laser using current from the PWM current source only, if the defined intensity value is less than the threshold intensity, wherein the PWM current source operates the laser by inputting to the laser a current which has an amplitude which is at least equal to the threshold current value of the laser, and wherein the duration of time over which the PWM current source inputs its current to the laser is such that the laser is operated to output a light beam which has an intensity equal to the defined intensity value.

A DAC (digital to analogue converter) current source is a current source that inputs digital values and outputs levels of currents corresponding, typically proportionally, to the input values. A PWM (pulse width modulation) current source is a current source which receives digital values as inputs, incorporating amplitude and time information per value, and outputs analog current amplitude with an output time for each value being modulated in relation to the input defined value and time respectively.

Preferably the method is a method of operating a laser of a projection device.

Preferably the laser is operated using current from the DAC current source only, if the defined intensity value is greater than the threshold intensity, and laser is operated using current from the PWM current source only, if the defined intensity value is less than the threshold intensity.

The method may further comprise the step of determining the threshold current of the laser.

Preferably the method furthers comprise the step of determining if the threshold current of the laser has changed.

The method may further comprise the step of, retrieving the duration of time over which the PWM current source inputs its current to the laser from a first look up table which comprises a plurality of different durations of time each corresponding with a different intensity value ranging from zero intensity up to, and including, the threshold intensity of the laser.

The method may further comprise the step of, generating a first look-up table which comprises entries comprising, a plurality of different intensity values for a light beam of the laser, up to, and including, the threshold intensity, and a different durations of time, corresponding with each of the plurality of different intensity values, over which the PWM current source should provide its current to the laser such that the laser is operated to output a light beam which has an intensity equal to the intensity value corresponding with that duration of time.

The method may further comprise the step of, retrieving the amplitude for the continuous current which the DAC current source inputs to the laser from a second look up table which comprises a plurality of different current amplitudes each corresponding with a different intensity value ranging from the threshold intensity up to, and including, a maximum intensity, wherein the maximum laser intensity is the intensity of light which is output from the laser when the input current to the laser is a maximum.

The method may further comprise the step of generating a second look-up table which comprises entries comprising a plurality of different intensity values for the laser from threshold intensity up to, and including, a maximum intensity, wherein the maximum intensity is the intensity of light which is output from the laser when the input current to the laser is a maximum; and a different current amplitudes, corresponding with each of the intensity values, wherein the different current amplitudes are the current amplitudes which the DAC current source should provide to the laser such that the laser is operated to output a light beam which has an intensity equal to the corresponding intensity value.

The method may further comprise the step of, generating a first look-up table which comprises a plurality of different durations of time each corresponding with a different intensity value ranging from zero intensity up to, and including, the threshold intensity ($K_{TH}$) of the laser.

The step of, generating a first look-up table comprises, determining the threshold current of the laser, determine the threshold intensity ($K_{TH}$) of the laser, and for each light intensity value from 0 to $K_{TH}$, read from a graph of optical output power against light intensity the optical output power required from the laser to provide light of that intensity, and determine the duration of time over which the PWM current source is required to supply current to the laser so that the laser outputs that optical output power. For each light intensity value from 0 to $K_{TH}$, the light intensity value and the corresponding determined duration of time may be entered in a table to build the first look up table.

The threshold intensity of the laser is the intensity of the light output from the laser when the laser is operated with an input current which is equal to the threshold current of the laser. The threshold intensity may be determined by operating the laser using an input current equal to the threshold current, and measuring the intensity of the light output from the laser.

The method may further comprise the step of, generating a second look-up table which comprises a plurality of different current amplitudes each corresponding with a different intensity value ranging from the threshold intensity ($K_{TH}$) up to, and including, a maximum intensity, wherein the maximum laser intensity is the intensity of light which is output from the laser when the input current to the laser is a maximum.

The step of generating a second look-up table may comprise the step of determining the threshold current of the laser, determine the threshold intensity ($K_{TH}$) of the laser, and for each light intensity value from $K_{TH}$ up to the maximum laser intensity, for each light intensity value from $K_{TH}$ to the maximum laser intensity measure the amplitude of the input current to the laser required to operate the laser to output a laser light which has that light intensity. For each light intensity value from value from $K_{TH}$ to the maximum laser intensity, the light intensity value and the corresponding input current required to operate the laser to output a laser light which has that light intensity may be entered in a table to build the second look up table.

The method may further comprise the steps of, detecting the orientation of a MEMS mirror which oscillates to scan a light beam output from the laser to project an image; obtaining a percentage value which corresponds to the detected orientation of the MEMS mirror; and multiplying the obtained percentage value by said current which is to be input to the laser from the DAC and/or PWM current to operate the laser to output a light beam which has an intensity equal to said defined intensity value, before said current is input to the laser, so as to compensate for a variation in the light intensity across the projected image which occurs due to variations in the speed of oscillation of a MEMS mirror which is used to scan the light beam output from the laser.

The method may further comprise the step of, generating a third look-up table which comprises a plurality of orientations for the MEMS mirror and percentage value corresponding with each of the plurality of orientations.

The step of generating the third look up table may comprise the steps of measuring the amplitude of oscillation of the MEMS mirror; dividing the amplitude of oscillation of the MEMS mirror into a plurality of discrete orientations; assigning a percentage values to each of the discrete orientations. The discrete orientations may be the angles relative to the horizontal normal or relative to a reference plane. Preferably a minimum percentage value (e.g. 1%) is assigned to the orientation which corresponds to the maximum amplitude; and the maximum percentage value (e.g. 100%) is assigned to the orientation which corresponds to the minimum amplitude. The orientation which corresponds to the minimum amplitude may be 0° i.e. when the MEMS mirror is horizontal. And the orientation which corresponds to the maximum amplitude may be the angle which the MEMS mirror makes with the horizontal normal, or to a reference plane.

The method may further comprise the step of operating the laser using current from both the DAC current source and PWM current source simultaneously.

The method may further comprise the step of operating the laser using a plurality of currents from a plurality of DAC current sources if the defined intensity value is greater than the threshold intensity, and operating the laser using a plurality of currents from a plurality of PWM current sources if the defined intensity value is less than the threshold intensity.

The method may further comprise the step of operating the laser using a plurality of currents from a plurality of DAC current sources if the defined intensity value is greater than the threshold intensity. The method may comprise the step of operating the laser using a plurality of currents from a plurality of PWM current sources if the defined intensity value is less than the threshold intensity.

The method may comprise the step of, selecting, using a multiplexer, one plurality of pulses to effect closing of a switch, each of the plurality of pulses comprising a different period, wherein the period of the pulse selected is equal to the duration of time over which the PWM current source should input its current to the laser such that the laser is operated to output a light beam which has an intensity equal to the defined intensity value, so that the switch is closed for said duration of time to allow current to pass from the PWM current source for said duration of time.

According to a further aspect of the present invention there is provided a laser driver for operating a laser source according to the method of claim 1, the driver comprising, a DAC current source and a PWM current source each of which are arranged such that they can selectively supply an input current to a laser; a processor which can receive image input data in which an intensity value for a light beam of the laser is defined; wherein the processor is further configured such that it can determine if the defined intensity value is greater than, or less than, a threshold intensity, wherein the threshold intensity is the intensity of the light which is output from the laser when the input current to the laser is equal to the threshold current of the laser, wherein the threshold current of the laser is an input current value below which the laser would operate in its light emitting region and equal to, or above which, the laser will operate in its laser region; wherein the processor is further configured to operate the laser using current from at least a DAC current source if the defined intensity value is greater than the threshold intensity, wherein the DAC current source operates the laser by inputting to the laser a continuous current which has an amplitude which is greater than the threshold current of the laser, and which has an amplitude such that the laser is operated to output a light beam which has an intensity equal to the defined intensity value; and wherein the processor is further configured to operate the laser using current from the PWM current source only, if the defined intensity value is less than the threshold intensity, wherein the PWM current source operates the laser by inputting to the laser a current which has an amplitude which is at least equal to the threshold current value of the laser, and wherein the duration of time over which the PWM current source inputs its current to the laser is such that the laser is operated to output a light beam which has an intensity equal to the defined intensity value.

The processor may be further configured determine the threshold current of the laser.

The processor may be further configured to generate a first and second look up table, wherein the first look up table comprises a plurality of different durations of time over which the PWM current source should input current to the laser so that, each duration of time corresponding with a different intensity value ranging from zero intensity up to, and including, the threshold intensity ($K_{TH}$) of the laser, and a second look up table which comprises a plurality of different current amplitudes which the DAC current source should apply, each current amplitude corresponding with a different intensity value ranging from the threshold intensity ($K_{TH}$) up to, and including, a maximum intensity, wherein the maximum laser intensity is the intensity of light which is output from the laser when the input current to the laser is a maximum.

The processor may be further configured to detect the orientation of a MEMS mirror which is used to scan the light from a laser; obtaining a percentage value which corresponds to the detected orientation of the MEMS mirror; and multiplying the obtained percentage value by said current which is to be input to the laser from the DAC and/or PWM current to operate the laser to output a light beam which has an intensity equal to said defined intensity value, before said current is input to the laser, so as to compensate for a variation in the light intensity across a projected image which occurs due to variations in the speed of oscillation of a MEMS mirror which is used to scan the light beam output from the laser.

The laser driver may comprises a plurality of PWM current sources to enable more level of input current and thus more levels light intensity to be achievable. The laser driver may comprises a plurality of DAC current sources to enable more level of input current and thus more levels light intensity to be achievable.

The PWM current source may comprise a second DAC current source and a switch which is moveable between an open and closed position, wherein the second DAC current source is configured to provide a current which is greater than, or equal to, the threshold current value and wherein when the switch is in an open position the current from the second DAC current source may be passed to the laser to operate the laser and when the switch is in its closed position current from the second DAC current source is prevented from passing to the laser, so that the switch can be used to define the duration of time over when the PWM current source inputs current to the laser.

The laser driver may further comprise a multiplexer. The output of the multiplexer is used to operate a switch, wherein the multiplexer is selectively operable to output one of a plurality of pulsed signals each of which has a different pulse duration. One of the plurality of pulsed signals may be selected to be output from the multiplexer depending on the period the switch must be closed so as to ensure that the intensity of the light beam output by the laser source will be equal to the defined intensity value.

The PWM current source is preferably configured to provide a current pulse which has an amplitude which is equal to the threshold current value

BRIEF DESCRIPTION OF THE DRAWINGS

The invention will be better understood with the aid of the description of an embodiment given by way of example and illustrated by the figures, in which:

FIGS. 4a and 4b illustrate first and second look-up-tables respectively;

DETAILED DESCRIPTION OF POSSIBLE EMBODIMENTS OF THE INVENTION

Figure 2A:
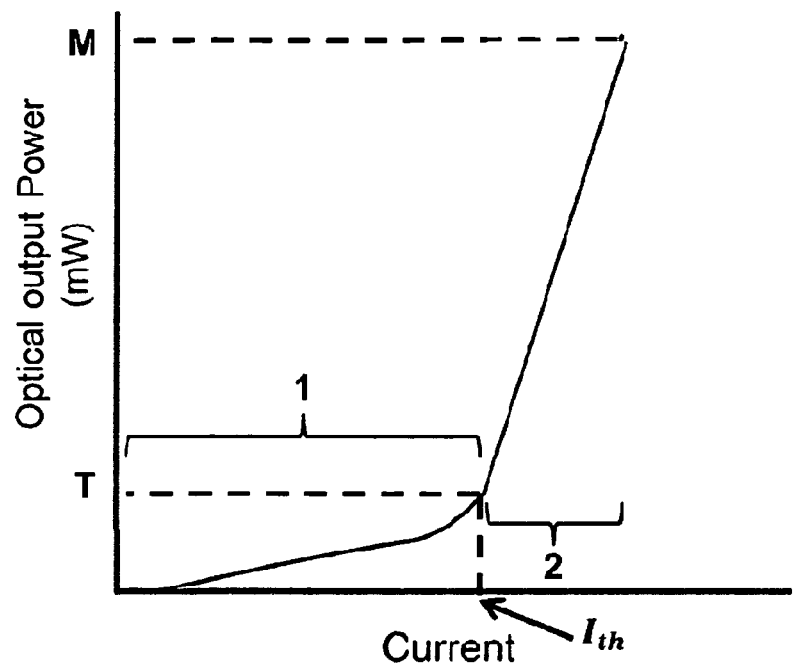
FIG. 2a provides a plot of input current to a laser against optical output power from the laser.

FIG. 2a provides a graph of the input current to a laser versus the optical output power the laser. The threshold current 6 is shown; when input current to the laser is less than the threshold current 6 then the laser operates in its light emitting region 1; when the input current to the laser is greater than the threshold current 6 then the laser operates in its laser region 2. The threshold current of a laser is therefore the input current above which the laser operates in its laser region 2 and below which the laser operates in its light emitting region 1. When the input current to the laser is equal to the threshold current 6 then the optical output power of the laser is known as the threshold optical output power.

Figure 2B:
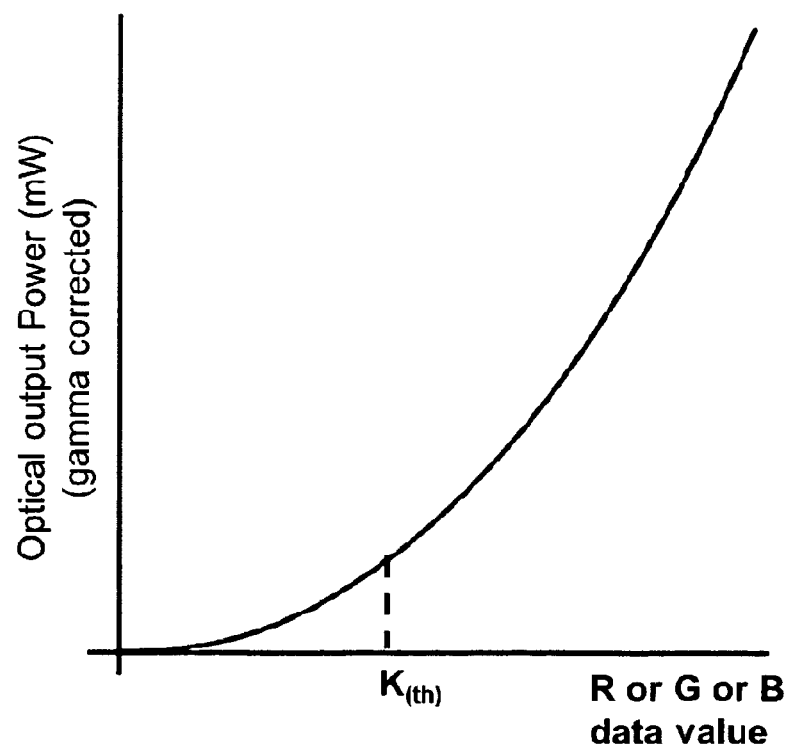
FIG. 2b a plot of laser light level (K) against optical output power from the laser (gamma corrected)

FIG. 2b further provides a graph of laser intensity (K) (here after referred to as a "K value" for the laser) versus the optical output power the laser. The laser intensity (K) is a digital number which represents a particular laser light intensity output from laser. Since the intensity of a pixel is defined by the intensity of the laser light, video/image input data which define the pixels of a video/image will include a K value for each of the lasers which are used to generate the pixels. For example to achieve a white pixel with a particular predefined intensity the video/image input data which defines that pixel include a K value for a red laser, a K value for a green laser and a K value for a blue laser. When the red, green and blue lasers are configured to have optical output powers which corresponds to the respective K values; the resulting light from each of the lasers can be combined to form a white pixel with the particular predefined intensity.

K values for a laser range from $0$-$2^{D-1}$, wherein D is the number of bits which define the level of intensity i.e. colour depth; for example if D=6 then there will be 256 possible different levels of intensity; if the laser is a laser which is configured to emit red light, then the laser can be configured to emit red light which has one of 256 different light intensity. Each of the 256 K values are distributed evenly along the x-axis of the graph shown in FIG. 2b, between zero and the maximum optical output power of the laser.

As discussed in the background, the pixels of a video/image will each be defined by a combination of red, green and blue light; the intensity of each colour will determine the colour and intensity of the pixel. Video/image input data which defines the pixels of image to be projected will specify a K value for each of the red, green and blue lasers so that each of the red, green and blue lasers will emit an intensity of light which is necessary to form a pixel of a predefined colour and intensity. The video/image input data will typically be provided by a graphical processor; the output of the graphical processor will be data required by a projector device form an image; this data will include K values for each of a green, red and blue light sources for each pixel which defines the video or image. For each pixel, the video/image input data will specify a K value for each of the red, green and blue lasers. From a graph similar to that shown in FIG. 2b which is specified in the datasheet for that laser, the corresponding optical output power for the laser can be read. From a graph similar to that shown in FIG. 2a which is specified in the datasheet for that laser, the input current required to be input to the laser to achieve that optical output power and thus the K value, can be determined.

It should be noted that a graph similar to FIG. 2a is provided in the datasheet for all lasers. Alternatively this graph may be constructed simply by supplying different levels of input current and recording the optical output power of the laser.

If the required input current is below the threshold current 6 of the laser, then the laser will be required to operate in its light emitting region 1. If the required input current is above the threshold current 6 then the laser will be required to operate in its laser region 2. As discussed in the background, it is undesirable for a laser to be operated in its light emitting region 1. The present invention provides a solution whereby a laser can operate in its laser region 2 while providing a light intensity which would otherwise require the laser to operate in its light emitting region 1.

Figure 1:
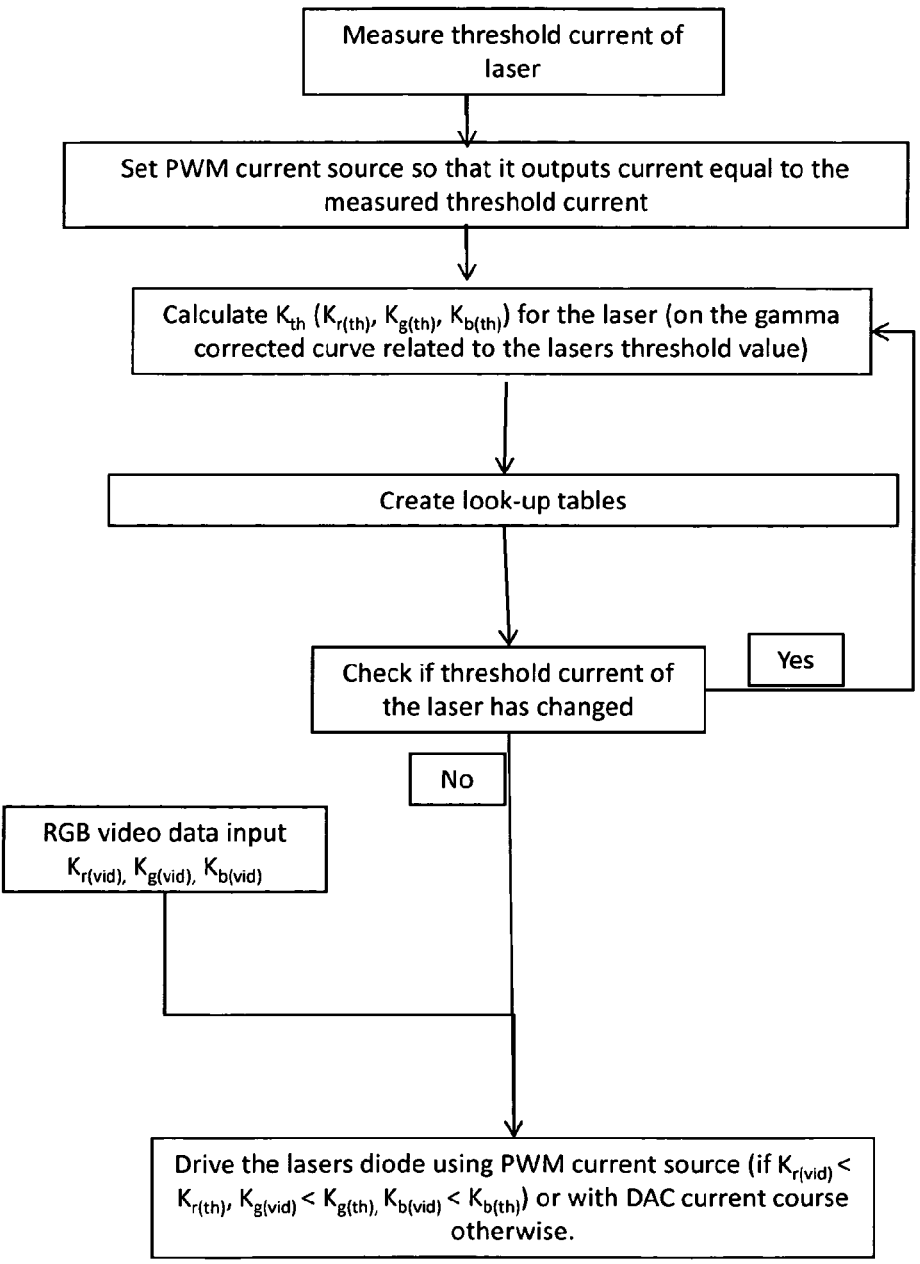
FIG. 1 is a flow chart illustrating the steps involved in a method according to an embodiment of the present invention.

FIG. 1 provides a flow chart illustrating the steps involved in a method according to the present invention. The method comprises the step of measuring the threshold current ($I_{TH\ red}$, $I_{TH\ green}$, $I_{TH\ blue}$) of a laser in a projection system. Measuring the threshold current ($I_{TH\ red}$, $I_{TH\ green}$, $I_{TH\ blue}$) of each laser can be done using methods well known in the art. For example, the threshold current value of a laser can be measured by measuring the optical output power of the laser for a plurality of different current inputs; and plotting these measurements to form a graph similar to FIG. 2a. The threshold current can be read from the graph as the current at which the slope of the graph changes.

A PWM (Pulse width modulator) current source and a DAC (Digital-to-analogue converter) current source are selectively used to supply current to the laser, to operate the laser.

Once the threshold current ($I_{TH\ red}$, $I_{TH\ green}$, $I_{TH\ blue}$) of the laser has been measured, the PWM current source is configured such that it output a current which has an amplitude equal to the threshold current ($I_{TH\ red}$, $I_{TH\ green}$, $I_{TH\ blue}$) of the laser. It will be understood that the PWM current source could alternatively be configured such that it output a current which has an amplitude greater than the threshold current ($I_{TH\ red}$, $I_{TH\ green}$, $I_{TH\ blue}$) of the laser.

Once the threshold current ($I_{TH\ red}$, $I_{TH\ green}$, $I_{TH\ blue}$) of each laser has been measured, a $K_{TH}$ value ($K_{TH\ red}$, $K_{TH\ green}$, $K_{TH\ blue}$) is determined for each of the laser when operated at the threshold current, wherein $K_{TH}$ is the intensity of the laser light when the laser is operated with the threshold current ($I_{TH\ red}$, $I_{TH\ green}$, $I_{TH\ blue}$) of the laser. The $K_{TH}$ value ($K_{TH\ red}$, $K_{TH\ green}$, $K_{TH\ blue}$) of the laser is determined according to the following equation:

$$K_{TH}=((T(2^D-1)G)/M)^{1/G} \qquad \text{Equ. 1}$$

Wherein, T is the optical output power of the laser when the input current to the laser is equal to the threshold current ($I_{TH\ red}$, $I_{TH\ green}$, $I_{TH\ blue}$) of the laser; G is Gamma which is a constant between 0-3 which defines the degree to which changes in brightness of the laser output can be perceived by a human eye (for example if G is equal to 3 then if the brightness of the laser output is doubled then the human eye will perceive double the brightness); D is the bit depth which is the number of bits which are used to define an intensity of light output from the laser, and M is the maximum optical output power of the laser required to achieve a predefined level of white light when combined with the light from the other lasers. Variables G, D and M are typically set by the user depending on the desired value of gamma, number of laser intensity levels (i.e. the number of possible K values for the laser), and a desired white illuminance point (e.g. D65, D55, which are international standards for white temperature, defining the amount of red, green and blue required to reach such defined white color temperature), while the T is measured directly using an optical feedback, or indirectly, using the laser datasheet, combined with a temperature sensor, the applied forward voltage and/or the laser diode capacitance. Once the $K_{TH}$ values ($K_{TH\ red}$, $K_{TH\ green}$, $K_{TH\ blue}$) for the laser has been determined, a first and second look up table is then generated for the laser. The generation of the first and second look up tables for the laser will be discussed in more detail later.

The first look-up table will comprise a list of K values from 0-$K_{TH}$ and a corresponding time period over which the PWM current source is required to supply current (which has an amplitude equal to the threshold current ($I_{TH\ red}$, $I_{TH\ green}$, $I_{TH\ blue}$) of the laser) to the laser, to operate the laser to provide optical output power which is necessary to achieve the corresponding K value. It should be remembered that the PWM current source was configured such that it outputs a current which has an amplitude equal to the threshold current ($I_{TH\ red}$, $I_{TH\ green}$, $I_{TH\ blue}$) of the laser, therefore the current supplied by the PWM current source to the laser will be equal to the threshold current ($I_{TH\ red}$, $I_{TH\ green}$, $I_{TH\ blue}$) of the laser.

The second look-up table will comprise a list of K values from $K_{TH}$-$K_2^D$-1 and a corresponding current value which DAC current source is required to supply to the laser, to operate the laser to provide optical output power which is necessary to achieve the corresponding K value.

Once the look-up tables have been generated a check is made to determine if the threshold current of the laser has changed. If the threshold current of the laser has changed then the steps of calculating the $K_{TH}$ value ($K_{TH\ red}$, $K_{TH\ green}$, $K_{TH\ blue}$) of the laser, and generating the look-up tables, are repeated using the 'new' threshold current value.

Determining if the threshold current of the laser has been changed can be done many different ways; in this example the threshold current ($I_{TH\ red}$, $I_{TH\ green}$, $I_{TH\ blue}$) of the laser is simply measured directly using methods known in the art; and the measured threshold current ($I_{TH\ red}$, $I_{TH\ green}$, $I_{TH\ blue}$) of the laser is then compared to the threshold current ($I_{TH\ red}$, $I_{TH\ green}$, $I_{TH\ blue}$) which was measured in the previous measurement to see if it has changed from the threshold current previously measured during the the first step of the method. In the event that there is no previous measurement of the threshold current to compare to (i.e. in the very first iteration of the method), then the measured to the threshold current ($I_{TH\ red}$, $I_{TH\ green}$, $I_{TH\ blue}$) can be compared to the threshold current specified in the datasheet of the laser.

A change in the threshold current ($I_{TH\ red}$, $I_{TH\ green}$, $I_{TH\ blue}$) of the laser will in turn change the threshold light T of the laser; according to equation 1 a change in the threshold light T of the laser will lead to a change in the $K_{TH}$ value. Accordingly, each of the look-up-tables must be regenerated so that they take account of the change in the $K_{TH}$ value of the laser. Therefore if it is determined that the threshold current ($I_{TH\ red}$, $I_{TH\ green}$, $I_{TH\ blue}$) of the laser has changed, then the steps of calculating the $K_{TH}$ value ($K_{TH\ red}$, $K_{TH\ green}$, $K_{TH\ blue}$) for the laser, and generating the look-up-tables are repeated.

Figure 8:
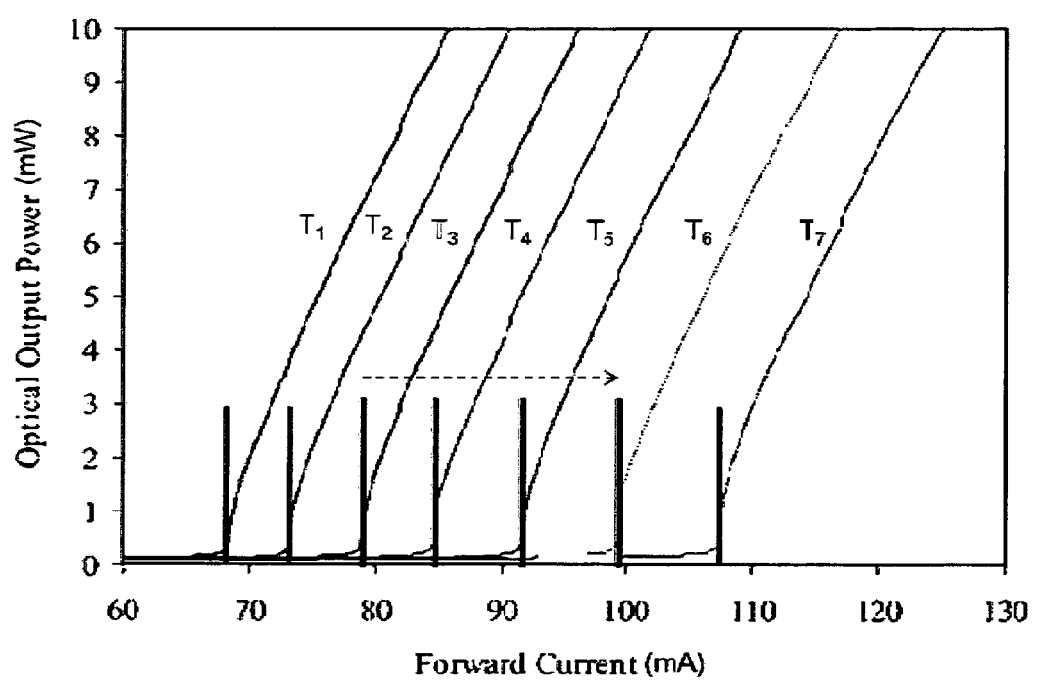
FIG. 8 is a graph illustrating how the threshold current of a laser changes with increasing temperature.

Alternatively, instead of measuring the threshold current directly, changes in the threshold current could be measured other techniques. For example, changes in the optical output power of the laser, temperature of the laser, capacitance of the laser, forward voltage of the laser, will all result in changes to the threshold current of the laser; therefore changes occurring in either of these parameters will indicate that the threshold current of the laser has changed; if changes in either of these parameters have occurred then it will indicate that the threshold current of the laser has changed requiring that the threshold current of the laser is being measured again, that the $K_{TH}$ value ($K_{TH\ red}$, $K_{TH\ green}$, $K_{TH\ blue}$) of laser is determined again, and that look-up tables are generated once again. FIG. 8 is a graph illustrating how the threshold current ($I_{TH}$) changes with an increase in temperature of the laser from a temperature $T_1$ to a temperature $T_7$.

If no change in the threshold current ($I_{TH\ red}$, $I_{TH\ green}$, $I_{TH\ blue}$) of the laser has occurred then method may advance to the next step.

For each pixel of a video/image, video/image input data will define a K value ($K_{VIDEO\ red}$, $K_{VIDEO\ green}$, $K_{VIDEO\ blue}$) for the laser, which defines the laser light intensity for that laser which is required for the generation of a pixel of a predefined colour and intensity. It will be understood that a laser driver will process the K values specified in the video/image input data and operate the laser so that the laser outputs a laser light which has an intensity level corresponding to the intensity level (K value) which was specified for that laser in the video/image input data. The K value for the laser ($K_{VIDEO\ red}$, $K_{VIDEO\ green}$, $K_{VIDEO\ blue}$) which is specified in the video/image input data will correspond to a particular optical output power for the laser; this is the optical output power required from the laser so that the pixel can be displayed with the correct colour and intensity. It will be understood that for each pixel of an video/image the video/image input data will define a K value ($K_{VIDEO\ red}$, $K_{VIDEO\ green}$, $K_{VIDEO\ blue}$) for each of a red, green and blue the laser. For simplicity in this example we will discuss what happens with respect to one of the lasers, however it will be understood that similar steps occur will typically occur in each of red, green and blue lasers of a projection device.

In the next step the K value ($K_{VIDEO\ red}$, $K_{VIDEO\ green}$, $K_{VIDEO\ blue}$) defined by the video/image input data, for laser, is compared to determined the $K_{TH}$ value ($K_{TH\ red}$, $K_{TH\ green}$, $K_{TH\ blue}$) for the laser, so as to determine if the laser should be supplied with the current from a PWM current source or supplied with a current from a DAC current source. If the K value ($K_{VIDEO\ red}$, $K_{VIDEO\ green}$, $K_{VIDEO\ blue}$) defined by the video/image input data is determined to be greater than the $K_{TH}$ value ($K_{TH\ red}$, $K_{TH\ green}$, $K_{TH}$ blue) for that laser, then that laser will be supplied with a current from the DAC current source. In this case the K value ($K_{VIDEO\ red}$, $K_{VIDEO\ green}$, $K_{VIDEO\ blue}$) defined by the video/image input data is identified in the second look-up-table and the current value in the second look-up-table which corresponds to that K value is read; the DAC current source is then operated to supply a current which has is equal to current value read from the look-up-table, to the laser.

If the K value ($K_{VIDEO\ red}$, $K_{VIDEO\ green}$, $K_{VIDEO\ blue}$) defined by the video/image input data for a laser is determined to be less than the $K_{TH}$ value ($K_{TH\ red}$, $K_{TH\ green}$, $K_{TH\ blue}$) of that laser, then that laser will be supplied with the current from the PWM current source; the laser will be supplied with the current from the PWM current source for a time duration necessary to ensure that the laser outputs an optical output power necessary to achieve the corresponding K value which was defined by video/image input data. In this case the K value ($K_{VIDEO\ red}$, $K_{VIDEO\ green}$, $K_{VIDEO\ blue}$) defined by the video/image input data is identified in the first look-up-table and the time duration which corresponds to that K value is read; the PWM current source is then operated to supply its current to the laser for a time duration equal to the time duration which was read from the first look-up-table.

Importantly since PWM was configured to output a current which is equal to the determined threshold current ($I_{TH\ red}$, $I_{TH\ green}$, $I_{TH\ blue}$) for that laser, if the K value ($K_{VIDEO\ red}$, $K_{VIDEO\ green}$, $K_{VIDEO\ blue}$) defined by video/image input data is determined to be less than the $K_{TH}$ value ($K_{TH\ red}$, $K_{TH\ green}$, $K_{TH\ blue}$) for that laser, then that laser will be required to have an optical power output which would ordinarily require the laser to supplied with a current which is less than the threshold current ($I_{TH\ red}$, $I_{TH\ green}$, $I_{TH\ blue}$) of that laser; thus requiring the laser to operate in its light emitting region. However, in the present invention, if the K value ($K_{VIDEO\ red}$, $K_{VIDEO\ green}$, $K_{VIDEO\ blue}$) defined by video/image input data is determined to be less than the $K_{TH}$ value ($K_{TH\ red}$, $K_{TH\ green}$, $K_{TH\ blue}$) of the laser, then the laser is supplied with the current from the PWM current source (which is equal to the threshold current of that laser). The duration of time with which the laser is supplied with the current from the PWM, is adjusted to ensure that the optical output power of the laser is sufficient to achieve the K value ($K_{VIDEO\ red}$, $K_{VIDEO\ green}$, $K_{VIDEO\ blue}$) defined by video/image input data. This will ensure that the laser is always operated in its laser region while still enabling all possible K values to be achieved. Accordingly, the laser is supplied with a current which has an amplitude which is at least equal to the threshold current ($I_{TH\ red}$, $I_{TH\ green}$, $I_{TH\ blue}$) of the laser, thus maintaining the laser in the laser region of operation, while the duration of time for which the PWM current source supplies current to the laser is such as to ensure the light output from the laser 33 is equal to the defined intensity value K which has been defined by video/image input data.

As discussed, if the K value ($K_{VIDEO\ red}$, $K_{VIDEO\ green}$, $K_{VIDEO\ blue}$) defined by the video/image input data is determined to be greater than the $K_{TH}$ value ($K_{TH\ red}$, $K_{TH\ green}$, $K_{TH\ blue}$) for that laser, then that laser will be supplied with a current from the DAC current source. Exceptionally, in this case, the laser may be simultaneously supplied with current from PWM current source in order to achieve fine tuning of the laser light. For example, if DAC can achieve a maximum of 256 different light intensity levels (i.e. the k values for the laser range from 0-255 i.e. D is equal to 8 bits i.e. the pixel intensities which the laser can achieve range from 0-255) and if the video input data specifies a K value for the laser which is 10 bits long (i.e. 1023 possible pixel intensity values) then the current from the DAC current source alone could not be used to K values specified in the video input data; however a combination of current from the DAC current source and current from PWM current source could be used to enable more input current levels and thus more light intensity levels to be achieved; accordingly the current from the PWM current course can be supplied in addition the current from the DAC current source so as to enable of any of the possible 1023 pixel intensity values specified in the video input data to be achieved.

Although the steps of the method illustrated in FIG. 1 have been described with respect to one single laser, it should be understood that the method illustrated in FIG. 1 is performed for each of the red green and blue lasers in a projection system. Therefore, in practice, each of the steps discussed above, are performed for each of the lasers in a projection device. Typically, each of the steps discussed above, are performed for a red, green and blue laser projected in a projection device. For each of the red, green and blue lasers a PWM (Pulse width modulator) current source and a DAC (Digital-to-analogue converter) current source may be provided.

Figures 3A, 3B:
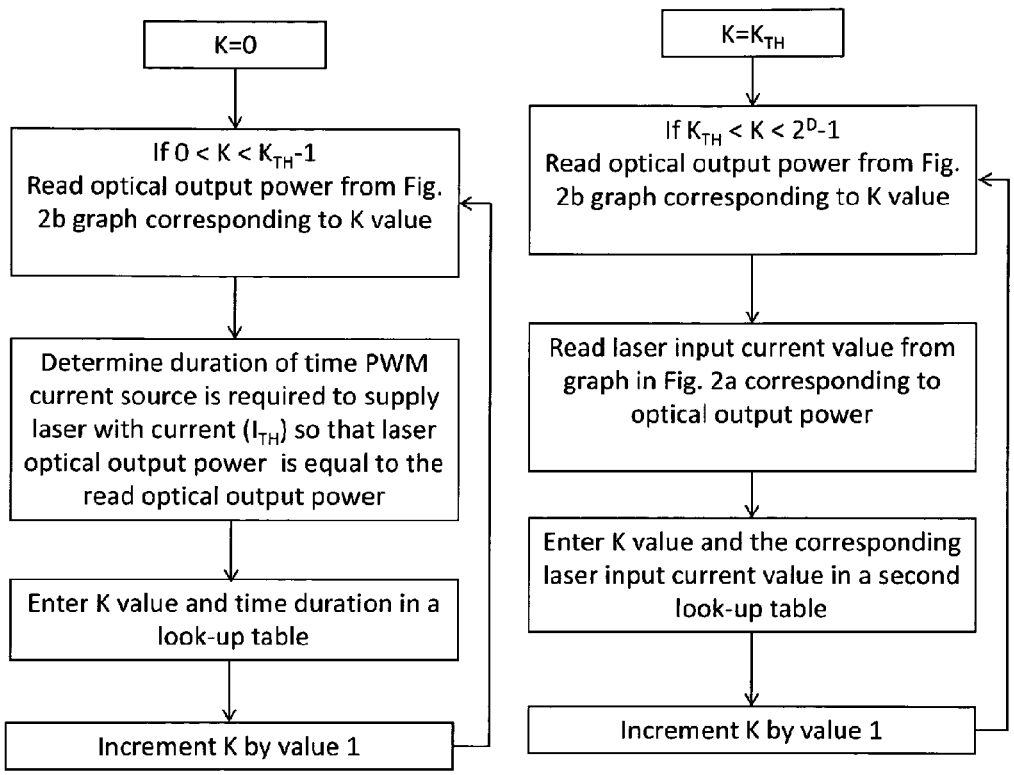
FIGS. 3a and 3b are flow charts illustrating the steps involved in generating first and second look-up-tables.

As discussed, once the $K_{TH}$ value ($K_{TH\ red}$, $K_{TH\ green}$, $K_{TH\ blue}$) for each laser has been determined, a first and second look up table is generated for each of the red, green and blue lasers. FIG. 3a provides flow chart illustrating the steps taken to generate the first look-up-table for a laser.

A graph showing the relationship between K values of a laser and the optical output power of the laser is shown in FIG. 2b. The graph of FIG. 2b is generated using the following equation: f(colour value)=maximal laser driving current×(colour value/($2^D$-1))$^G$ wherein f is the optical output power for each value of pixel, the maximal laser driving current is the current required to reach the laser maximal optical output power and is read from a datasheet of the laser or measured, and colour value is the value of the color coming from the data video input the optical output D is the number of bit for the colour and G is the predefined gamma value. Using this graph, for each K value, the corresponding optical output power for of the laser is read from the graph.

Next, for each K value between 0<K<$K_{TH}$, the duration of time over which the PWM current source is required to supply its current (which equal to the threshold current of the laser) to the laser, so that the laser will output an optical power equal to the optical power read from the graph of FIG. 2b, is determined. The duration of time can be easily determined mathematically as it is directly proportional to the optical output power of the laser when the laser is operated with its threshold current ($I_{TH\ red}$, $I_{TH\ green}$, $I_{TH\ blue}$); for example if pixel intensity value is K for the laser, as specified in the video/image input data, is half the value of $K_{TH}$ of the laser, this would mean that an optical output power which is half optical output power of the laser when the laser is operated with its threshold current ($I_{TH\ red}$, $I_{TH\ green}$, $I_{TH\ blue}$) is required; as duration of time over which the PWM current source is required to supply its current to the laser, is directly proportional to the optical output power of the laser, it can be determined that the duration of time over which the PWM current source is required to supply its current to the laser is half of the normal pixel time (i.e. when 100% of pixel time). The value for K, along with the determined duration of time over which the PWM current source is required to supply its current to the laser is, entered in the first look-up-table. K in incremented by a 1 and the steps are repeated until K is equal to $K_{TH}$. Finally, the first look-up-table will contain a list of values for K between 0 to $K_{TH}$ and duration of time for the PWM current source (i.e. the pulse period), corresponding which each of the K values.

FIG. 4a illustrates a first look-up table 200. The first look-up table 200 comprise a list of K value 201 between 0 to $K_{TH}$-1, for each K value a corresponding duration of time 202 over which PWM current source is required to supply its current (which is equal to the threshold current of the laser) to the laser in order to achieve that corresponding K value, is provided. Since the amplitude of the current supplied by the PWM current source is constant and has an amplitude equal to the threshold current of the laser, the duration of time over which the PWM current source supplies current to the laser is adjusted to enable the laser to have output different optical output power, thus enabling different K values from 0 up to K=$K_{TH}$-1 to be achieved.

In addition to the graph showing the relationship between K values of a laser and the optical output power of the laser as shown in FIG. 2b, a graph showing the relationship between optical output power of the laser and input current to the laser, as shown in FIG. 2a, is used to generate the second look-up table. Typically the graphs of FIGS. 2a and 2b are provided in the datasheets of all lasers; however preferably the graphs shown in FIGS. 2a and 2b are generated in a laser calibration step. In the laser calibration step input current to the laser is increased from 0 to a maximum allowed input current for the laser; the optical output power of the laser and the intensity of a pixel on a display screen which is defined by the light output from the laser, are measured. The input current may be plotted against the optical output power to form the graph shown in FIG. 2b and the pixel intensity may be plotted against the optical output power to form the graph shown in FIG. 2a.

FIG. 3b provides flow chart illustrating the steps taken to generate the second look-up-table for a laser. To generate the second look-up-table, for each K value between $K_{TH}<K<2^{D-1}$ the corresponding optical output power of the laser is read from the graph shown in FIG. 2b (graph derived from measurements or read from the datasheet of the laser). From the graph in FIG. 2a the input current required to achieve that optical output power can be read. The value for K, along with the corresponding input current read from the graph in FIG. 2a, is entered in the second look-up-table. K in incremented by a 1 and the steps are repeated until K is equal to $2^{D-1}$.

FIG. 4b illustrates the second look-up table 205. The second look-up table 205 comprises a list of K values 203 from $K_{TH}$ up to $2^{D-1}$ (wherein D is the bit depth which is the number of bits which are used to define an intensity of light output from the laser). For each K value from $K_{TH}$ up to $2^{D-1}$ a corresponding input current amplitude 204 which the DAC current source is required to supply to the laser in order to achieve that K value, is provided.

It should be remembered that a first and second look-up-table is generate for each of the red, green and blue lasers in a projection device.

Figure 5:
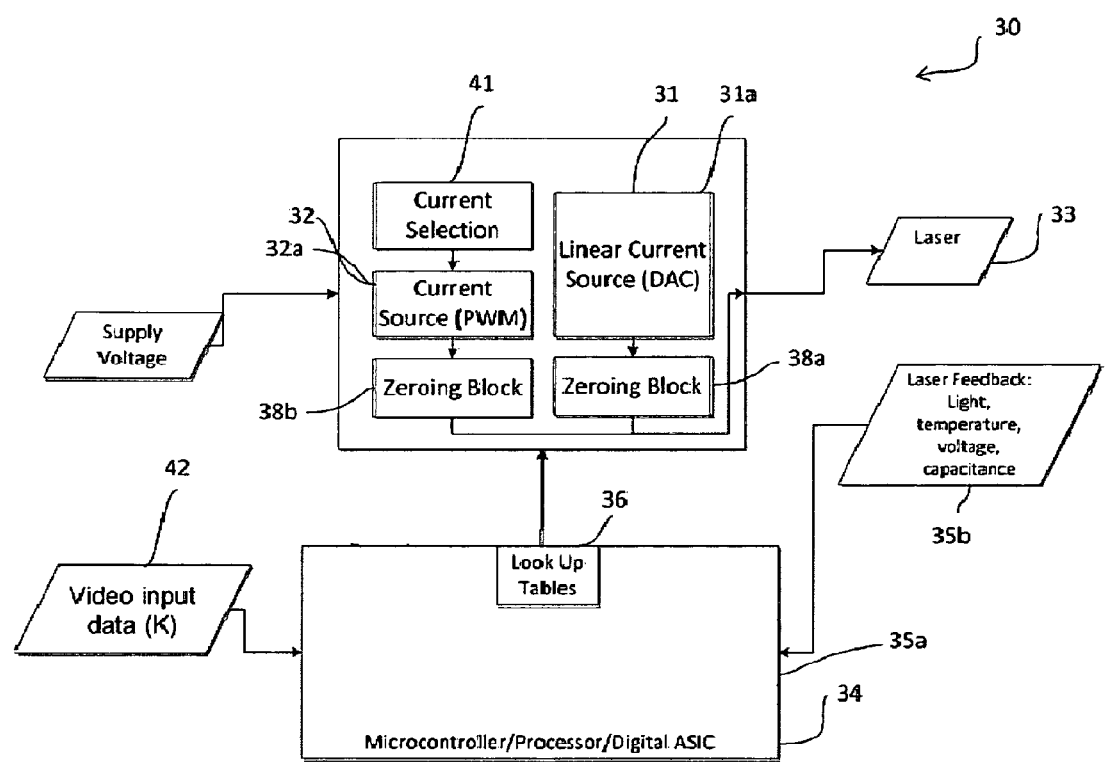
FIG. 5 is a schematic of a laser driver according to an embodiment of the present invention.

FIG. 5 provides a schematic diagram of a laser driver 30 according to one embodiment of the present invention, which is operable to perform the method described above to operate a laser 33. Typically a projection device will comprise three such laser drivers 30; a first to operate a red laser, a second to operate a green laser and a third to operate a blue laser; each of the lasers will perform the method described above to operate a respective laser.

The laser driver 30 comprises a DAC current source 31 and PWM current source 32 each of which are operably connected to the laser 33. PWM current source 32 is configured to provide a current while the DAC current source 31 is configured to provide a continuous current signal. The amplitude of the current provided by the PWM current source 32 is set so that it is equal to the threshold current ($I_{TH}$) of the laser 33 and the DAC current source 31 is configured to provide a continuous current of any amplitude greater than the threshold current of the laser 33.

Zeroing blocks 38a,b control the flow of current from each of the DAC current source 31 and PWM current source 32 to the laser 33. The zeroing block 38a, can be configured to selectively pass, or block, current passing from the DAC current source 31 to the laser 33; the zeroing block 38b, can be configured to selectively pass, or block, current passing from the PWM current source 32 to the laser 33. In other words each of the zeroing blocks 38a,b acts as a switch which can be selectively closed to pass current or opened to block the passage of current. When the zeroing block 38a is configured to pass current, a continuous current signal from the DAC current source 31 can be passed to the laser 33 to operate the laser 33; when zeroing block 38b is configured to pass current, then a current from the PWM current source 32 is passed to the laser 33 to operate the laser 33. Each of the zeroing blocks 38a and 38b may be integral to the DAC current source 31 and PWM current source 32 respectively.

In an alternative embodiment of the present invention one or both of the zeroing blocks 38a,b may be configured such that they each allow at least a predetermined minimum current to continually pass from both the DAC current source 31 and PWM current source 32 to the laser 33. Advantageously this will enable faster laser switching time. Thus a residual current may be continually passed from each of the DAC current source 31 and PWM current source 32 to the laser 33 to enable faster switching time.

The laser driver further comprises a measurement means 35a for determining the threshold current value of the laser 33. Such means are well known in the art. The measurement means 35a receives inputs such as optical output power of the laser 33, temperature of the laser, voltage across the laser, and capacitance of the laser; and may use one or more of these inputs to determine the threshold current value of the laser 33 using known methods.

The laser driver further comprises a processing means 34. The processing means 34 is configured to generate first and second look-up-tables for the laser, and to store the first and second look-up-tables in a memory 36.

The processing means 34 is configured to receive video/image input data 42 from an external video source such as a graphical processor; as previously discussed the video/image input data 42 will define a K value for the laser, so that the laser is operated to provide a optical power output necessary to enable a pixel of predefined colour and intensity to be projected. The processing means 34 is further configured to use the generated first and second look-up-tables to determine whether the laser 33 should be operated with the current from the PWM current source 32 or with the continuous current from the DAC current source 31, depending on a K value specified in video/image input data.

The processing mean 34 receives a K value from the video/image input data and first identifies in which look-up table K value can be found. If the K value is in the first look-up-table, then the processing means 34 determines that the laser 33 should be operated with the current from the PWM current source 32 (which is equal to the threshold current of the laser 33). The processing means 34 can read from the first look-up-table the duration of time for which the PWM current source 32 should supply its current to the laser 33 in order to achieve the K value. The processing means 34 thus operates the zeroing block 38b so that it passes current for the duration of time which was read form the first look-up table; thus allowing the PWM current source 32 to supply current (which is equal to the threshold current of the laser 33) to the laser for a duration of time which was read form the first look-up table.

On the other hand, if K value video/image input data 42 which the processing means 34 receives, is in the second look up table, then the processing means 34 determines that the laser 33 should be operated with the continuous current signal from the DAC current source 31. The processing means 34 can read from the second look up table the corresponding current amplitude which the DAC current source 31 should supply to the laser 33 so that the K value specified in the video/image input data 42 is achieved. The processing means 34 then configures the DAC current source 31 so that it outputs a current which has an amplitude equal to the current amplitude read from the second look up table. The processing mean 34 operates the zeroing block 38a so that it passes current thus allowing the current from the DAC current source 31 to pass to the laser 33.

In the present invention the laser is driven with the current which is always above the threshold current of the laser. When the laser is required to provide a particular optical output power to achieve a K value which would usually require the laser to operate in its LED region, the laser is supplied with a current (from the PWM current source) which is equal to the threshold current of the laser and the duration of time for which that current is supplied is set to ensure that the optical output power of the laser is sufficient to achieve the K value. Thus, the laser is always supplied with a current which is greater than or equal to the threshold current of the laser thus maintaining the laser operating in its laser region.

Typically, the laser driver 30, or a plurality of said laser drivers 30, will be incorporated into a projection device (not shown) and arranged to be operably connected with one or more lasers 33 within the projection device so that the laser driver(s) can operate the one or more lasers 33. Typically three laser drivers 30 will be provided within a projection device, each laser driver 30 being operably connected to a laser, typically a red, green or blue laser respectively.

Figure 6:
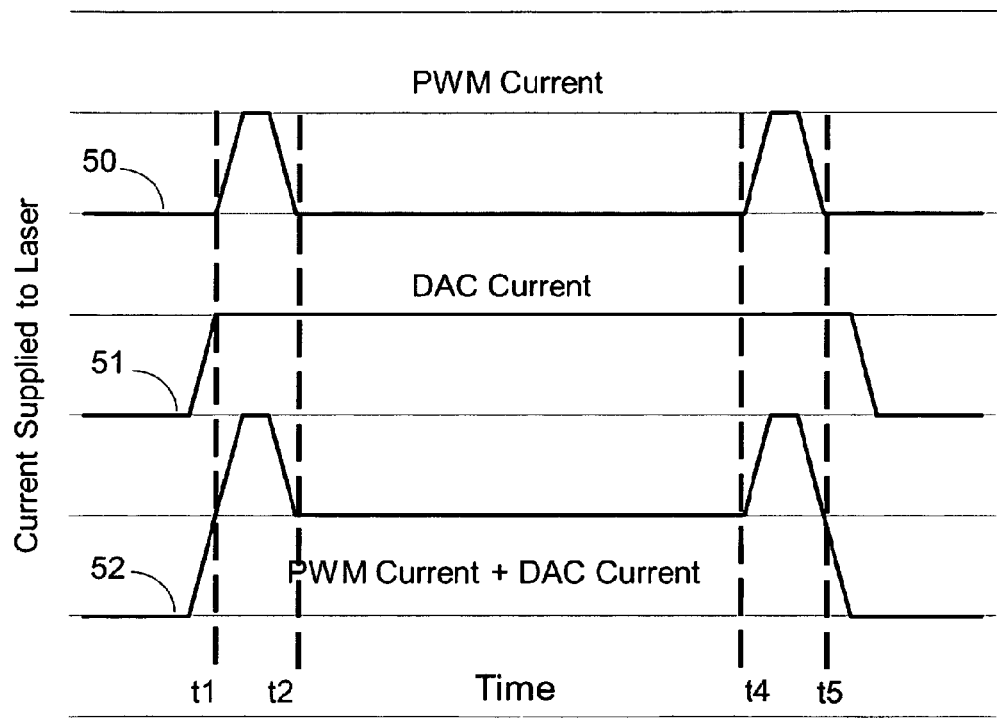
FIG. 6 illustrates the current from the DAC current source and the PWM current source when the laser driver of FIG. 5 is operated in an overdrive mode.

Optionally, the laser driver 30 may be operated in an overdrive mode. In overdrive mode the laser 33 is supplied simultaneously with current from the DAC current source and current from the PWM current source i.e. current from the DAC current source 31 and PWM current source 32 is simultaneously input to the laser 33; this increases the intensity of the light output from the laser 33. FIG. 6 illustrates the current 51 from the DAC current source and the current 50 from the PWM current source; the total current 52 which is input to the laser 33 is also illustrated; the total current input to the laser 33 is the addition of the current 51 from the DAC current source and the current 50 from the PWM current source. As can be seen from FIG. 6, in the period t1-t2 and in the period t4-t5 the laser 33 is driven with current which has an amplitude which greater than the amplitude of the DAC current 51 or PWM current 50, alone; as a result the intensity of the light emitted from the laser 33 during the periods t1-t2 and t4-t5 is increased.

Figure 7:
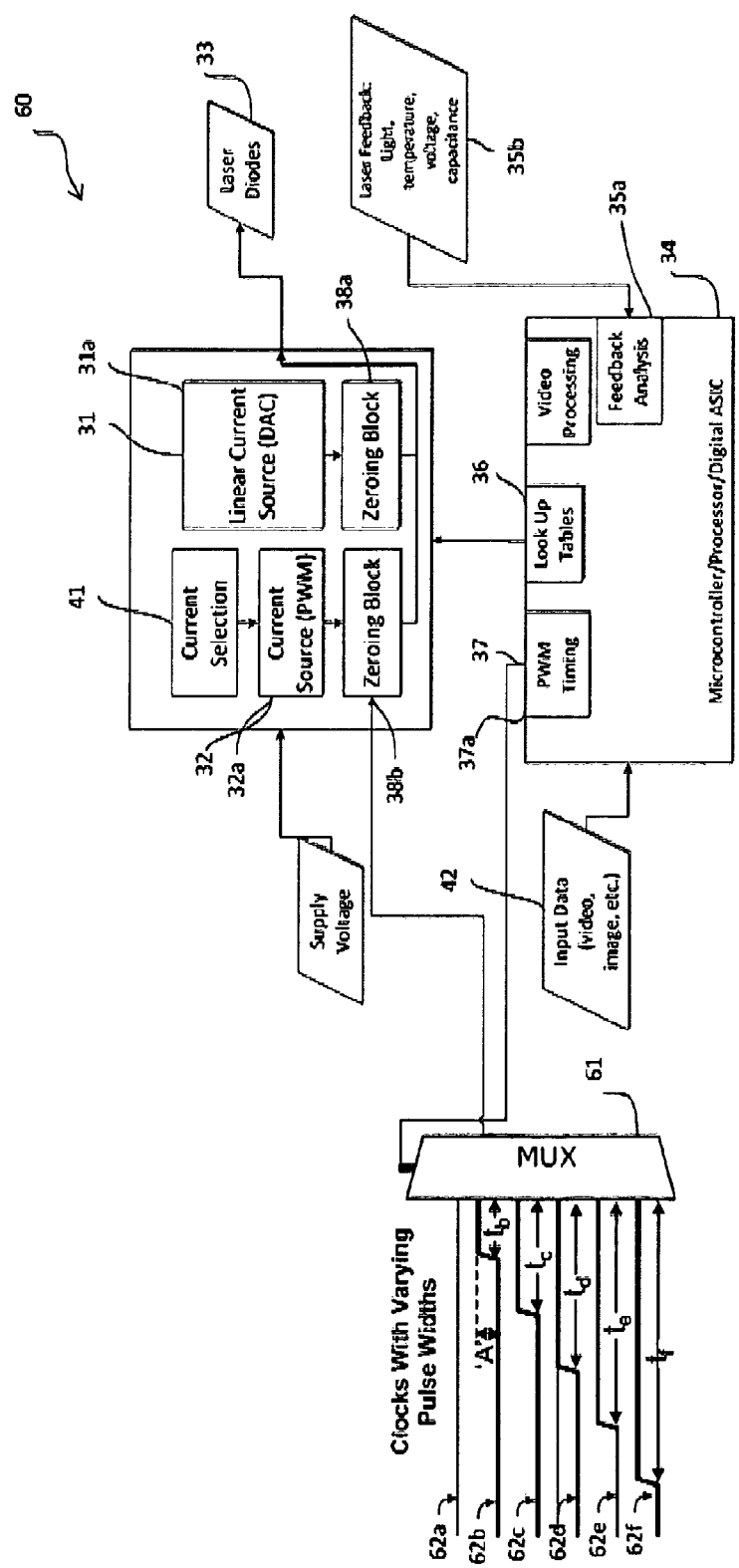
FIG. 7 is a schematic of a laser driver according to a further embodiment of the present invention.

FIG. 7 illustrates a laser driver 60 according to a further embodiment of the present invention. The laser driver 60 has many of the same features of the laser driver 30 shown in FIG. 5 and like features are awarded the same reference numbers.

The laser driver 60 further comprises a multiplexer 37a which can be operated to select one of plurality of activation signals 62a-f to operate the zeroing block 38b. Each of the activation signals 62a-f comprises a signal which has an amplitude "A" for different time durations ($t_a$-$t_f$). When a zeroing block 38 a,b receives an activation signals 62 a-f it will be configured to pass current for the duration over which the activation signals 62 a-f has an amplitude "A".

During use the processing means 34 receives a K value from the video/image input data and first identifies in which look-up table K value can be found. If the K value is in the first look-up-table, then the processing means 34 determines that the laser 33 should be operated with the current from the PWM current source 32 (which is equal to the threshold current of the laser 33). The processing means 34 can read from the first look-up-table the duration of time for which the PWM current source 32 should supply its current to the laser 33 in order to achieve the K value.

The processing means 34 then selects, using the multiplexer, an activation signals 62a-f which has an amplitude "A" for a time period which is equal to the duration of time which the processor 34 read from the first-look-up table. The zeroing block 38b will thus be configured to allow current to pass from the PWM current source 32 to the laser 33 for the appropriate duration of time required for the laser to achieve a K value as specified in the video/image input data.

Figure 9:
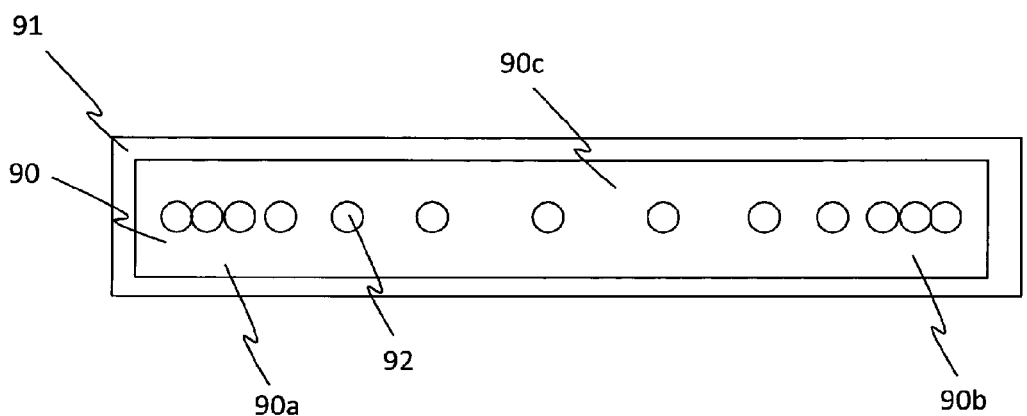
FIG. 9 illustrates the uneven distribution of pixels in a projected image due to variations in the speed of oscillation of a MEMS mirror.

As discussed, typically three laser drivers 30 will be provided within a projection device, each laser driver 30 being operably connected to a red, green or blue laser respectively. The light from the red, green and blue lasers will be combined to define the pixels of the video/image. The light from red, green and blue lasers is scanned across a display screen so that successive pixels of a video/image can be displayed on the display screen. Typically a MEMS mirror, which is configured to oscillate about one or more oscillation axes is used to scan the light from red, green and blue lasers across the display screen. As the MEMS mirror oscillates the speed of oscillation of the MEMS mirror will vary over the amplitude of oscillation; for example as the MEMS mirror will oscillate in a clockwise direction, and then at the maximum amplitude of oscillation the mirror changes its direction of oscillation and begins to oscillation back in an anti-clockwise direction. As the MEMS mirror reaches its maximum amplitude of oscillation, the speed of oscillation of the MEMS mirror will slow, at the point of maximum amplitude of oscillation the MEMS mirror will stop before beginning to oscillate back in an anti-clockwise direction. Once the MEMS mirror begins the oscillate back in the anti-clockwise direction the speed of oscillation will again accelerate. The variation in the speed of oscillation of the MEMS mirror, will lead to a variation in the distance between successive pixels which are projected on the display screen; for example the distance between successive pixels which have been defined by light reflected by the MEMS mirror to the display screen while the MEMS mirror was oscillating at a maximum speed of oscillation will be more than the distance between successive pixels which have been defined by light reflected by the MEMS mirror to the display screen while the MEMS mirror was oscillating at a minimum speed of oscillation. Overall, this will lead to an uneven distribution of pixels, with some parts of the video/image having a higher density of pixels than other parts; the parts of the video/image which have a higher density of pixels than other will appear brighter than the parts of the video/image which have a lower density of pixels. FIG. 9 illustrates an image 90 which has an uneven distribution of pixels 92. The image 90 has been displayed on a display screen 91 using a projection device which uses an oscillating MEMS mirror to scan light. It can been seen in FIG. 9 that parts 90a,b of the image 90 have a higher density of pixels 92 than another part of the image 90c; as a result of the higher density of pixels 92, the parts 90a,b of the image 90 will appear brighter than the part 90c of the image.

The PWM current source provided in the drive of the present invention may also be used in order to compensate for the variation in the brightness across the image which is caused by the variation in the speed of oscillation of the MEMS mirror; and thus ensuring an equal brightness across the whole of the image.

Figure 10:
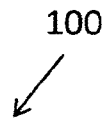
FIG. 10 illustrates a third look up table which may be used in a method of the present invention.

FIG. 10 illustrates an example of a third look-up table 100. The third look up table 100 comprises a plurality of discrete orientations Θ of the oscillating MEMS mirror; in this example the MEMS mirror oscillates from a horizontal orientation 0° to an orientation of −+75° relative to the horizontal normal. For each discrete orientation Θ there is provided a corresponding percentage value %.

The method of the present invention may further comprise the step of detecting the orientation of the MEMS mirror; obtaining a percentage value which corresponds to the detected orientation; and multiplying the obtained percentage value by the current which is to be input to the laser from the DAC and/or PWM current source. The orientation of the MEMS mirror may be the angular orientation of the MEMS mirror. The percentage value may be obtained from a third look up table which comprises a plurality of angular orientations for the MEMS mirror and a percentage corresponding to each of the angular orientations. The method may further comprise the step of generating a third look-up table which comprises a plurality of orientations for the MEMS mirror and percentage value corresponding with each of the plurality of orientations. The third look up table may be generated by, measuring the whole amplitude of oscillation of the MEMS mirror; dividing the amplitude by a predefined number of discrete orientations; assigning a percentage value to each of the discrete orientations. Preferably the number of percentage values will be half the number of discrete orientations. The orientations are preferably represented as the angular displacement of the MEMS mirror from the horizontal normal. The step of assigning a percentage value to each of the discrete orientations preferably comprises assigning a maximum percentage value to the minimum angular displacement and assigning a minimum percentage value to the maximum angular displacement. The percentage increase by a fixed amount from the maximum angular displacement to the minimum angular displacement. The minimum angular displacement is preferably 0° and represents when the MEMS mirror is horizontal.

Multiplying the current which is to be input to the laser by the percentage value will decrease the current which is input to the laser from the DAC and/or PWM current source when the MEMS mirror is oscillating slowly, consequently the intensity of the pixels in the parts of the projected image which have a high density of pixels (i.e. part 90a,b of image 90 shown in FIG. 9) will be decreased in intensity, while the pixels in the part of the projected image which have a low density of pixels (i.e. part 90c of image 90 shown in FIG. 9) will be reduced little or not at all. The decrease in the intensity of the pixels in the parts of the projected image which have a high density of pixels will ensure the intensity across the whole of the projected image 90 is even.

In an alternative embodiment, during the periods when the MEMS mirror is oscillating at a speed higher than a threshold oscillation speed, both the PWM current source and the DAC current source may be operate to input current to the laser. Thus, during the periods when the MEMS mirror is oscillating at a speed higher than a threshold oscillation speed, the input current to the laser will be increased. As the input current to the laser is increased, the optical output power of the laser will thus be increased, thus increasing the intensity or brightness of the light output from the laser and thus increasing the brightness of the resulting pixels. Accordingly, the spacing between the resulting pixels will large due to the slow oscillation of the MEMS mirror, but each pixel will have an increased brightness due to the fact that both the PWM current source and the DAC current source operate to input current to the laser. During the period of the during the periods when the MEMS mirror is oscillating at a speed which is below the threshold oscillation speed, either the PWM current source or the DAC current source are operated to input current to the laser, so that the intensity or brightness of the light output from the laser is decreased. Accordingly when the MEMS mirror is oscillating at a speed which is below the threshold oscillation speed the resulting pixels will have decreased brightness. However, the low speed of oscillation of the MEMS mirror will ensure the spacing between successive pixels is small, thus increasing the density of constant across the whole video/image. Accordingly the pixels which are projected onto the display screen when the MEMS mirror is oscillating at a speed which is a above the oscillation speed will have low density but high brightness, and the pixels which are projected onto the display screen when the MEMS mirror is oscillating at a speed which is a below the oscillation speed will have a high density but low brightness; this in the brightness across the whole of the video/image being equal.

The PWM current source can be used to achieve spatial dithering, which involves modifying the optical output power of the laser for one or more pixels which surround a target pixel in order to accommodate to the target pixel. The visual result is then that the viewer will perceived more colour levels on the image, even if the DAC and PWM current sources have lower number of colour levels.

It should be understood that although the present invention has been described with respect to a single PWM and DAC current source, the laser driver of the present invention may be provided with more than one PWM current source and/or more than one DAC current source. Providing more than one PWM current source and/or more than one DAC current source will enable more current levels to be input to the laser. For example a DAC current source is a 6 bit DAC current source i.e. can provide 256 different current amplitudes ($0-2^6$), then providing a second DAC current source which is a 6 bit DAC current source would enable 512 different current amplitudes to be input to the laser i.e. $2*(0-2^6)$; likewise if more than one PWM current sources are provided. Advantageously providing more than one PWM current source and/or more than one DAC current source will enable more precision in the current which is input to the laser i.e. more current levels, thus enabling more pixel intensities to be achieved. This technique can typically be used to have fine control in dark regions of the image. Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A method comprising:
defining an intensity value for a light beam to be output from a laser;
determining whether the defined intensity value is greater than a threshold intensity for the laser, the threshold intensity corresponding to an intensity of light to be output from the laser when an input current to the laser is equal to a threshold current, the threshold current corresponding to an input current value below which the laser would operate in its light emitting region and equal to, or above which, the laser will operate in its laser region; and
operating the laser using current from a digital to analog converter (DAC) current source based on a determination that the defined intensity value is greater than the threshold intensity, the DAC current source to supply a current to the laser, the current to have a first amplitude equal to or greater than the threshold current to cause the laser to generate a light beam to have an intensity substantially equal to the defined intensity value; or
operating the laser using current from a pulse width modulated (PWM) current source based on a determination that the defined intensity value is not greater than the threshold intensity, the PWM current source to supply the current to the laser for a duration of time to cause the laser to generate the light beam to have an intensity substantially equal to the defined intensity value, the current to have a second amplitude equal to or greater than the threshold current value.

2. The method of claim 1, comprising determining the threshold current.

3. The method of claim 2, comprising retrieving the duration of time from a first look-up table, the first look-up table to include indications of a plurality of durations of time, each of the plurality of durations of time corresponding to an intensity value between zero intensity and the threshold intensity.

4. The method of claim 3, comprising generating the first look-up table.

5. The method of claim 3, comprising retrieving the first amplitude from a
second look-up table, the second look-up table to include indications of a plurality of current
amplitudes, each of the plurality of current amplitudes corresponding to an intensity value between the threshold intensity and a maximum intensity for the laser.

6. The method of claim 5, comprising generating the second look-up table.

7. The method of claim 1, comprising:
detecting an orientation of a MEMS mirror, the MEMS mirror to oscillate to scan a light beam output from the laser to project an image;
obtaining a percentage value, the percentage value to correspond to the detected orientation of the MEMS mirror; and
adjusting either the first current or the second current based on the obtained percentage value to compensate for a variation in the light intensity across the projected image due to variations in a speed of oscillation of the MEMS mirror.

8. The method of claim 1, comprising generating a third look-up table, the third look-up table to include indications of a plurality of orientations of the MEMS mirror and a plurality of percentage values corresponding with each of the plurality of orientations.

9. The method of claim 1, comprising operating the laser using both the first current and the second current simultaneously.

10. The method of claim 1, the first current supplied by multiple DAC current sources or the second current supplied by multiple PWM current sources.

11. A laser driver comprising:
a digital to analog converter (DAC) current source operably coupled to a laser;
a pulse width modulated (PWM) current source operably coupled to the laser;
a processor; and
a controller to execute on the processor, the controller to:
receive an information element to include an indication of an intensity value;
determine whether the defined intensity value is greater than a threshold intensity for the laser, the threshold intensity corresponding to an intensity of light to be output from the laser when an input current to the laser is equal to a threshold current, the threshold current corresponding to an input current value below which the laser would operate in its light emitting region and equal to, or above which, the laser will operate in its laser region; and
send a control signal to the DAC current source based on a determination that the defined intensity value is greater than the threshold intensity, the control signal to include an indication to supply a current to the laser, the current to have a first amplitude equal to or greater than the threshold current to cause the laser to generate a light beam to have an intensity substantially equal to the defined intensity value; or
send a control signal to the PWM current source based on a determination that the defined intensity value is not greater than the threshold intensity, the control signal to include an indication to supply the current to the laser for a duration of time to cause the laser to generate the light beam to have an intensity substantially equal to the defined intensity value, the current to have a second amplitude equal to or greater than the threshold current value.

12. The laser driver of claim 11, the controller to determine the threshold current.

13. The laser driver of claim 12, the controller to retrieve the duration of time from a first look-up table, the first look-up table to include indications of a plurality of durations of time, each of the plurality of durations of time corresponding to an intensity value between zero intensity and the threshold intensity.

14. The laser driver of claim 13, the controller to generate the first look-up table.

15. The laser driver of claim 13, the controller to retrieve the first amplitude from a second look-up table, the second look-up table to include indications of a plurality of current amplitudes, each of the plurality of current amplitudes corresponding to an intensity value between the threshold intensity and a maximum intensity for the laser.

16. The laser driver of claim 15, the controller to generate the second look-up table.

17. The laser driver of claim 11, the controller to:
detect an orientation of a MEMS mirror, the MEMS mirror to oscillate to scan a light beam output from the laser to project an image;
obtain a percentage value, the percentage value to correspond to the detected orientation of the MEMS mirror; and
adjust either the first current or the second current based on the obtained percentage value to compensate for a variation in the light intensity across the projected image due to variations in a speed of oscillation of the MEMS mirror.

18. The laser driver of claim 11, the controller to generate a third look-up table, the third look-up table to include indications of a plurality of orientations of the MEMS mirror and a plurality of percentage values corresponding with each of the plurality of orientations.

19. The laser driver of claim 11, the first control signal and the second control signal to include an indication to operate the laser using both the first current and the second current simultaneously.

* * * * *